(12) United States Patent
Bartley et al.

(10) Patent No.: US 7,838,336 B2
(45) Date of Patent: Nov. 23, 2010

(54) METHOD AND STRUCTURE FOR DISPENSING CHIP UNDERFILL THROUGH AN OPENING IN THE CHIP

(75) Inventors: Gerald K. Bartley, Rochester, MN (US); Darryl J. Becker, Rochester, MN (US); Paul E. Dahlen, Rochester, MN (US); Philip R. Germann, Oronoco, MN (US); Andrew B. Maki, Rochester, MN (US); Mark O. Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 11/860,226

(22) Filed: Sep. 24, 2007

(65) Prior Publication Data
US 2009/0079060 A1    Mar. 26, 2009

(51) Int. Cl.
*H01L 21/98* (2006.01)

(52) U.S. Cl. .................. 438/109; 257/21.705
(58) Field of Classification Search .......... 438/106–127
See application file for complete search history.

(56) References Cited

U.S. PATENT DOCUMENTS

| 7,303,935 | B2 * | 12/2007 | DeNatale et al. | 438/48 |
| 2002/0076919 | A1 * | 6/2002 | Peters et al. | 438/637 |
| 2008/0293191 | A1 * | 11/2008 | Nakanishi et al. | 438/126 |

OTHER PUBLICATIONS

Alec J. Babiarz; "Paradigm Shift in Applying Underfill"; Asymtek, Carlsbad, CA; ajbabiarz@asymtek.com.

* cited by examiner

*Primary Examiner*—Savitri Mulpuri
(74) *Attorney, Agent, or Firm*—Dillon & Yudell LLP

(57) ABSTRACT

A method of making an integrated circuit package includes forming a through hole in an integrated circuit and assembling a die containing the integrated circuit on a carrier so that the die is mechanically and electrically connected to the carrier. Thereafter, an underfill material is dispensed between the die and the carrier via the through hole.

6 Claims, 3 Drawing Sheets

METHOD AND STRUCTURE FOR DISPENSING CHIP UNDERFILL THROUGH AN OPENING IN THE CHIP

BACKGROUND OF THE INVENTION

1. Technical Field

The present invention relates in general to integrated circuitry and, in particular, to dispensing of chip underfill.

2. Description of the Related Art

An integrated circuit (IC) chip is conventionally mounted to a carrier or substrate in one of two ways. According to a first technique, the IC chip is mounted with its electrically conductive pads oriented upward and with wire bonds connecting the pads to pins on the outside of the carrier, which in turn electrically connect the IC chip to external circuitry. Alternatively, the IC chip can be mounted with its pads oriented downward as a so-called "flip chip", in which case solder bumps (also referred to as a Controlled Collapse Chip Connection (C4)) are used to directly connect the chip pads to the associated external circuitry.

The connection between the flip chip and the carrier is vulnerable to mechanical stress, which if great enough, can cause at least one C4 connection to fail. Consequently, in most cases, flip chips are underfilled with an electrically insulative adhesive to enhance the strength of the mechanical connection between the flip chip and the carrier.

Currently, the most common technique for applying underfill to a flip chip is to dispense the underfill material with a needle dispenser along one or more edges of the IC chip and to rely upon capillary action to cause the underfill material to flow beneath the IC chip and around the solder bumps. A disadvantage of this technique of applying underfill is that the underfill material can form a wide fillet on one or more sides of the IC chip, forcing a minimum spacing to be observed and reducing the component density that can be achieved on the carrier.

An alternative technique that has been proposed is to underfill IC chips from the backside of the carrier via a through hole formed in the carrier. However, this presents a significant design and fabrication challenge for large chip carriers (e.g., large ceramic multi-chip modules (MCMs)), which may have numerous layers and are designed to carry large number of chips.

SUMMARY OF THE INVENTION

A method of making an integrated circuit package includes forming a through hole in an integrated circuit and assembling a die containing the integrated circuit on a carrier so that the die is mechanically and electrically connected to the carrier. Thereafter, an underfill material is dispensed between the die and the carrier via the through hole.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION OF ILLUSTRATIVE EMBODIMENT

Figure 1A:
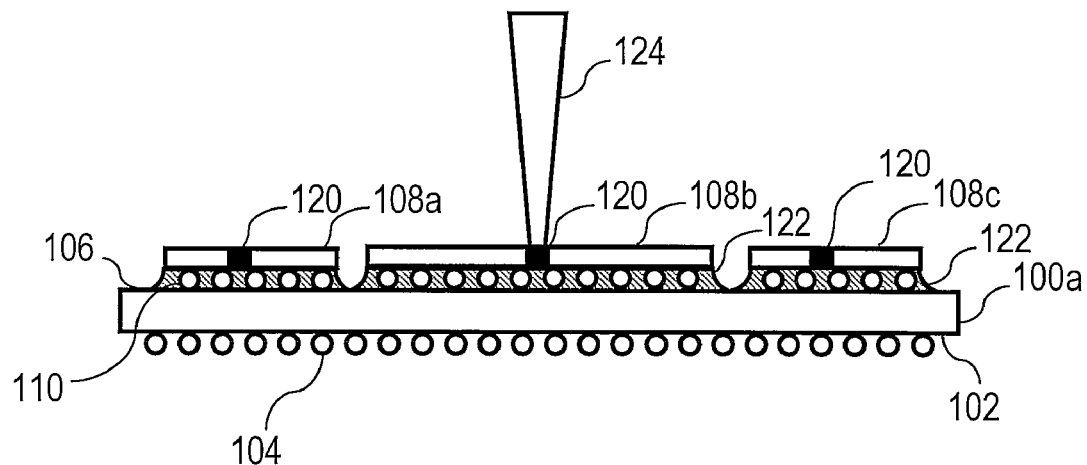
FIG. 1A is a sectional view of a chip carrier that carries integrated circuit (IC) chips each having a through hole formed therein through which underfill can be dispensed.

With reference to the figures in which like reference numerals identify like and corresponding features, and in particular with reference to FIG. 1, there is illustrated a sectional view of a chip carrier that carries integrated circuit (IC) chips or dice each having a through hole formed therein through which underfill can be dispensed. As shown, chip carrier 100a, which may comprise, for example, a ceramic MCM carrier, has a backside 102 on which are disposed a number of solder bumps 104 for mechanically and electrically connecting chip carrier 100a to other circuitry. On its front side 106, chip carrier 100a carries a number of IC chips 108a, 108b, 108c electrically and mechanically connected to chip carrier 100a by solder bumps 110.

As depicted, each of IC chips 108a, 108b and 108e has at least one (and possibly multiple) through hole(s) 120 formed therein. Through holes 120 permit an underfill material 122, such as a conventional underfill adhesive, to be applied to the underside of IC chips 108 by an underfill dispenser 124 via through holes 120. Capillary action or forced dispense causes the underfill to disperse under substantially all of the underside of each IC chip 108, resulting in a strong mechanical bond between each IC chip 108 and carrier 100a. To achieve adequate coverage, it is preferred, but not required, for each IC chip 108 to have a substantially central through hole 120.

As will be appreciated, chip carriers, such as that illustrated in FIG. 1A, are themselves typically assembled together with other components to form an electrical assembly. The electrical assembly includes at least one (and often many) chip carriers and a power supply electrically coupled to the at least one chip carrier. Of course, the electrical assembly may include additional components, as is known in the art.

Figure 1B:
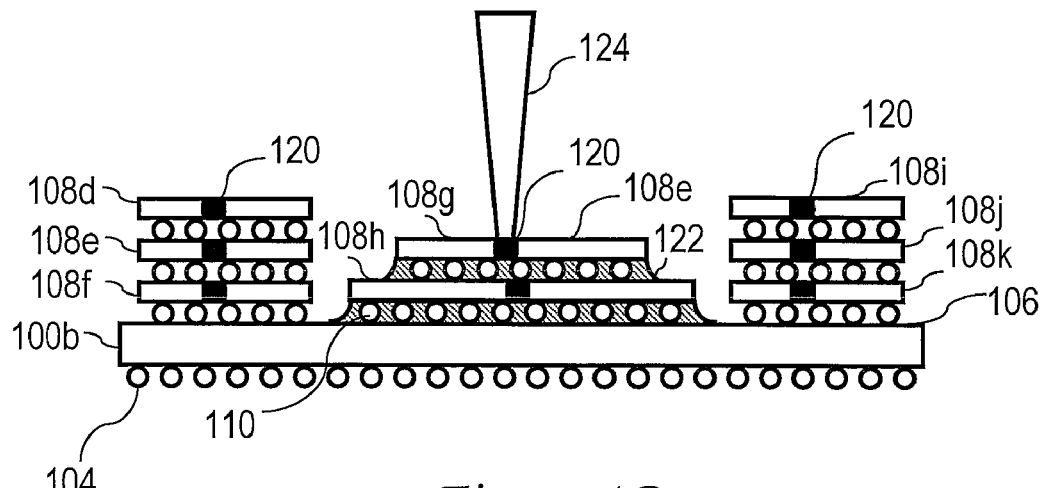
FIG. 1B is a sectional view of a system-in-package in which underfill is dispensed via through holes formed in stacked dice.
Figure 1C:
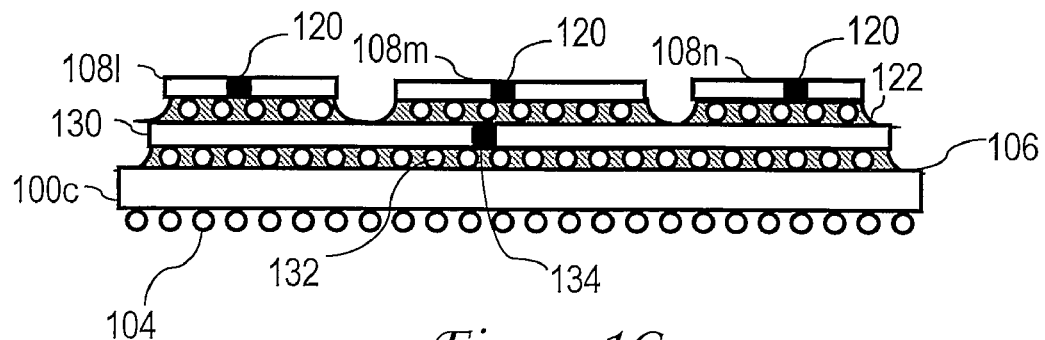
FIG. 1C is a sectional view of a chip carrier that carries a silicon carrier under which underfill is dispensed via through holes formed in dice.
Figure 1D:
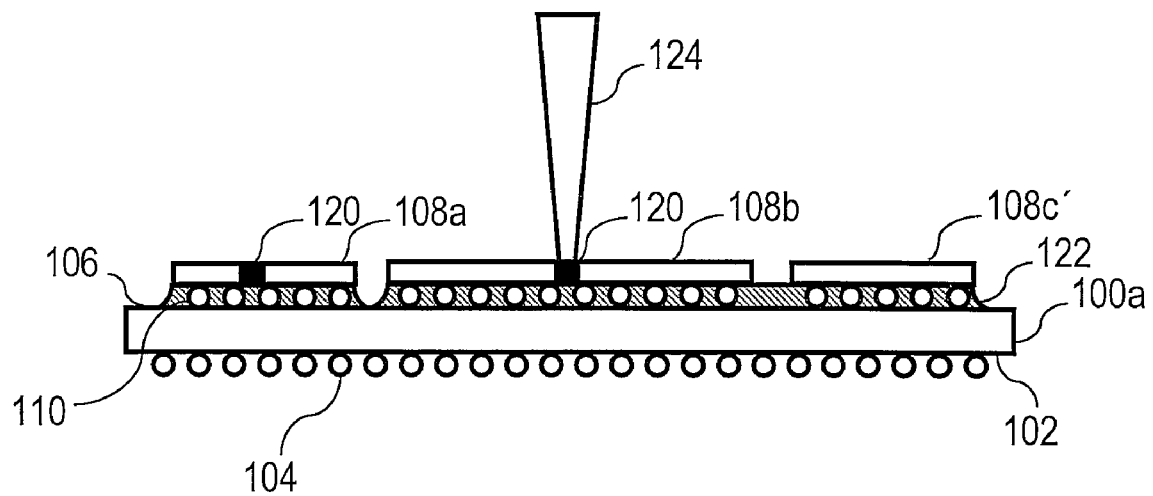
FIG. 1D is a sectional view of a chip carrier that carries IC chips, where a through hole formed in a first IC chip is utilized to underfill a second IC chip.

FIG. 1D depicts an alternative embodiment of the chip package shown in FIG. 1A. In the depicted alternative embodiment, IC chip 108e' does not have a through hole formed therein. A through-chip underfill dispense technique can still be employed for IC chip 108c', however, in that because IC chip 108c' is adjacent to IC chip 108b, the underfill dispense via through hole 120 of IC chip 108b can be utilized to underfill IC chip 108c' too.

Referring now to FIG. 1B is a sectional view of a system-in-package in which underfill for flip chips is dispensed via through holes formed in stacked dice. As indicated by like reference numerals, the depicted system-in-package includes a chip carrier 100b similar to that depicted in FIG. 1A. Carrier 100b of FIG. 1B carries multiple IC chips or dice 108, where at least some of the IC chips 108 are stacked. In the depicted embodiment, IC chips 108d, 108e and 108f, which may comprise, for example, memory chips, are mechanically and electrically interconnected in a first chip stack; IC chips 108g-108h, which may comprise, for example, a processor and associated bridge chip, are mechanically and electrically interconnected in a second chip stack; and IC chips 108i, 108j and 108k, which may comprise, for example, additional memory chips, are mechanically and electrically interconnected in a third chip stack. The bottom IC chip 108 in each chip stack is electrically and mechanically connected to chip carrier 100b.

Because each IC chip 108 includes at least one through hole 120, underfill material 122 can be dispensed throughout each IC stack and under each IC chip 108 by utilizing an underfill dispenser 124 to dispense underfill material 122 via the through hole 120 of the top IC chip 108 in each IC stack. Capillary action or forced dispense causes the underfill to disperse under substantially all of the undersides of the IC chips 108, as shown with respect to IC chips 108g and 108h. (FIG. 1B depicts an underfill dispense in process prior to underfill being dispensed in the chip stacks containing IC chips 108d-108f and 108i-108k.) After completion of the underfill dispense, a strong mechanical bond between each IC chip 108 and either the underlying IC chip 108 or carrier 100b is obtained. It should be noted that in embodiments in which IC chips 108 are stacked, through holes 120 of the IC chips 108 can be, but are not required to be aligned.

With reference now to FIG. 1C, there is illustrated a sectional view of a chip carrier that carries a silicon carrier under which underfill is dispensed via through holes formed in dice. As indicated by like reference numerals, the depicted package includes a chip carrier 100c similar to that depicted in FIGS. 1A-1B. Carrier 100c of FIG. 1C, which as noted above may be formed of ceramic, carries a semiconductor (e.g., Si) carrier 130 that has a through hole 134 formed therein and that is mechanically and electrically connected to carrier 100c by solder bumps 132. Semiconductor carrier 130 contains integrated voltage regulators and provides decoupling for multiple IC chips or dice 108i-108n that are mechanically and electrically coupled to it.

As with previous embodiments, each of IC chips 108i-108n preferably includes at least one through hole 120 through which underfill material 122 can be dispensed by an underfill dispenser. Capillary action or forced dispense causes the underfill dispensed via the through holes 120 in IC chips 108i-108n to disperse under substantially all of the undersides of the IC chips 108, as well as to disperse under semiconductor carrier 130 via through hole 134. In this manner, a strong mechanical bond between each IC chip 108 and semiconductor carrier 130 and between semiconductor carrier 130 and carrier 100c is achieved.

Figure 2:
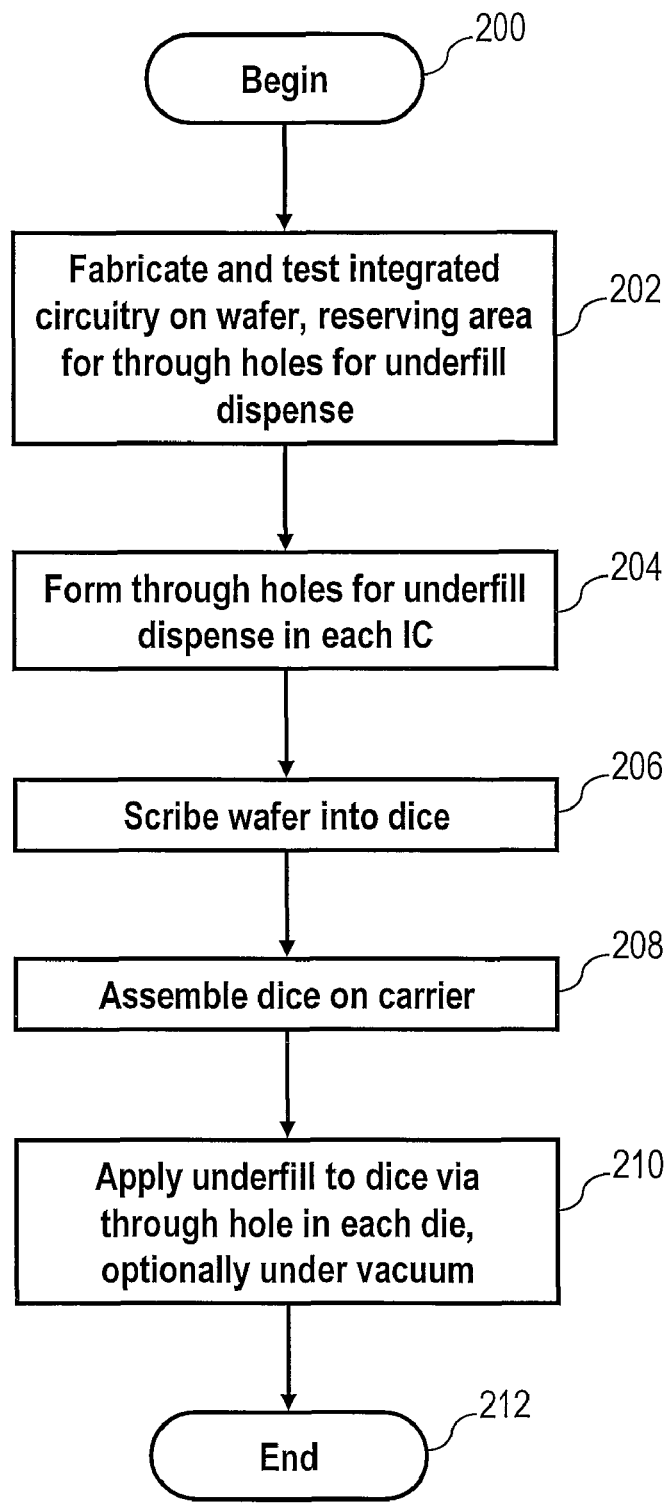
FIG. 2 is a high level logical flowchart of an exemplary embodiment of a method of fabricating integrated circuit packages in accordance with the present invention.

Referring now to FIG. 2, there is depicted a high level logical flowchart of an exemplary embodiment of a method of fabricating IC packages in accordance with the present invention. As illustrated, the process begins at block 200 and then proceeds to block 202, which depicts fabrication and wafer testing of integrated circuitry within a semiconductor wafer utilizing any conventional or future developed technique. As noted in block 202, during the fabrication of the integrated circuitry, area is reserved for at least one through hole in each IC in order to support subsequent underfill dispensing.

Following block 202, the process proceeds to block 204, which depicts forming a through hole 120 in each reserved area on the wafer. In a preferred embodiment, through holes 120 are formed by lasing each reserved area on the wafer to form a through hole 120. Through holes 120 may have a dimension, for example, of approximately 1 mm diameter. With this size of opening, a 16 mm square chip having an area of 256 square mm would only need to be expanded 0.0156 mm in each dimension to compensate for the loss of area attributable to a through hole 120.

The process then proceeds from block 204 to block 206, which illustrates scribing the wafer into dice. In a preferred embodiment, scribing the wafer into dice is performed with the same laser utilized to form through holes 120. After the wafer has been scribed into dice, one or more dice (possibly of different sizes and/or containing different circuitry) are assembled onto a carrier, for example, in one of the configurations shown in FIGS. 1A-1C (block 208).

Thereafter, the process proceeds to block 210, which illustrates applying underfill to the dice on the carrier via at least one through hole 120 in each die. The underfill can be dispensed utilizing a needle-type or jet-type dispenser, as is known in the art. To assist in spreading the underfill and to eliminate potential voiding, a vacuum fixture may optionally be placed over the carrier and a vacuum may be applied. Following block 210, the process terminates at block 212.

As has been described, the present invention provides an improved IC package and method for dispensing underfill via through holes in IC chips. The present invention advantageously supports many package configurations including those including multi-layer IC stacks. With the present invention, the spacing around the perimeter of chips is reduced as compared to IC packages fabricated employing prior art underfill dispense techniques, permitting closer chip spacing. As a result, page size can be reduced, and decoupling performance is enhanced.

While the invention has been particularly shown as described with reference to a preferred embodiment, it will be understood by those skilled in the art that various changes in form and detail may be made therein without departing from the spirit and scope of the invention.

What is claimed is:

1. The method of making an integrated circuit package, said method comprising:
    forming a through hole in an integrated circuit;
    assembling a die containing said integrated circuit on a carrier, wherein said assembling comprises mechanically and electrically connecting the die to the carrier; and
    thereafter, dispensing an underfill material between the die and the carrier via the through hole, wherein the die is a first die,
    said assembling include assembling the first die and a second die in vertical stack on the carrier, wherein the second die is electrically and mechanically nonelected to first die and has a through hole formed therein; and
    said dispensing includes dispensing the underfill material between the second die and the first die via through hole in the second die.

2. The method of claim 1, wherein the vertical stack includes a third die.

3. The method of claim 1, wherein the through hole in the first die and the through hole in the second die are unaligned along a vertical axis of the vertical stack.

4. The method of claim 1, wherein said dispensing includes dispensing said underfill material while a vacuum is applied to the die.

5. The method of claim 1, wherein said forming includes lasing the through hole.

6. The method of claim 1, wherein:
    the die is a first die;
    the assembling includes assembling a second die on the carrier adjacent the first die; and
    the dispensing includes dispensing the underfill material between the second die and the carrier via the through hole.

* * * * *